(12) United States Patent
Tschanz et al.

(10) Patent No.: US 7,096,433 B2
(45) Date of Patent: Aug. 22, 2006

(54) METHOD FOR POWER CONSUMPTION REDUCTION

(75) Inventors: James W. Tschanz, Portland, OR (US); Nasser A. Kurd, Portland, OR (US); Javed Barkatullah, Portland, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 275 days.

(21) Appl. No.: 10/703,562

(22) Filed: Nov. 10, 2003

(65) Prior Publication Data

US 2005/0102642 A1    May 12, 2005

(51) Int. Cl.
  *G06F 17/50*    (2006.01)
(52) U.S. Cl. .................... 716/1; 716/6; 716/8; 716/10; 716/11
(58) Field of Classification Search .................... 716/1, 716/6–11; 327/156
  See application file for complete search history.

(56) References Cited

U.S. PATENT DOCUMENTS

| | | | | |
|---|---|---|---|---|
| 5,852,728 A | * | 12/1998 | Matsuda et al. ............ | 713/501 |
| 5,982,210 A | * | 11/1999 | Rogers ........................ | 327/156 |
| 6,072,348 A | * | 6/2000 | New et al. ................... | 327/295 |
| 6,211,703 B1 | * | 4/2001 | Takekuma et al. .......... | 326/101 |
| 6,300,809 B1 | * | 10/2001 | Gregor et al. ............... | 327/200 |
| 6,400,199 B1 | | 6/2002 | Liu et al. | |
| 6,608,513 B1 | | 8/2003 | Tschanz et al. | |
| 6,938,225 B1 | * | 8/2005 | Kundu .......................... | 716/1 |
| 2004/0124881 A1 | * | 7/2004 | Thadikaran et al. .......... | 326/93 |

OTHER PUBLICATIONS

James Tschanz et al.; "Comparative Delay and Energy of Single Edge-Triggered & Dual Edge-Triggered Pulsed Flip-Flops for High-Performance Microprocessors, Microporcessor Research Labs, Intel Corporation," ISPLED '01, Aug. 6-7, 2001, Huntington Beach, CA; pp. 147-152.

* cited by examiner

Primary Examiner—Paul Dinh
(74) Attorney, Agent, or Firm—Fleshner & Kim, LLP

(57) ABSTRACT

A method and chip design are provided for reducing power consumption. A first functional block having a phase logic circuit may be provided in a first area of a chip. A second functional block having an edge-triggered circuit may be provided in a second area of the chip. Edge-triggered circuits within the second functional block may be replaced with dual edge-triggered circuits. Phase logic circuits may be clocked by a full frequency clock signal and dual edge-triggered circuits may be clocked by a half-frequency clock signal.

24 Claims, 8 Drawing Sheets

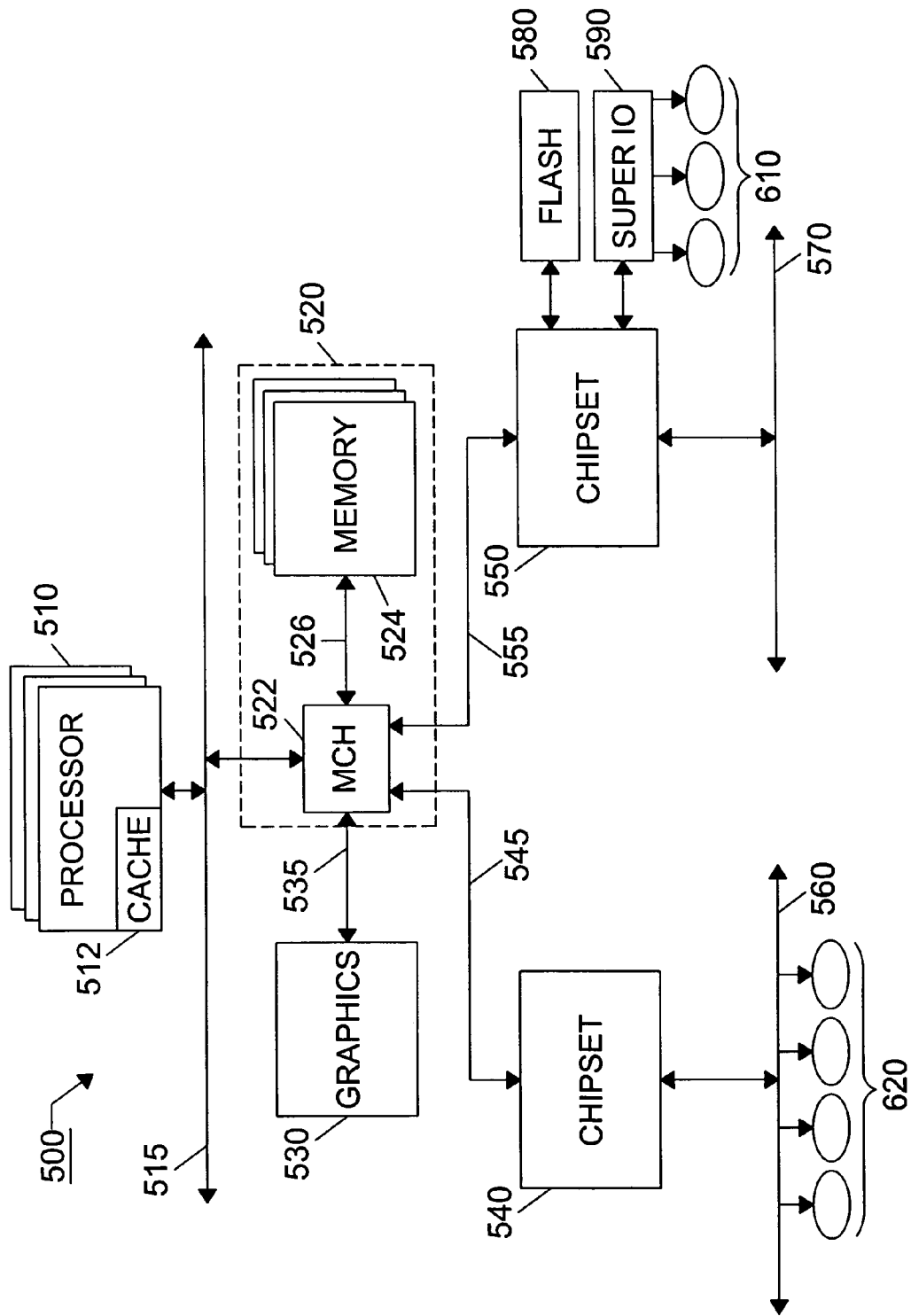

METHOD FOR POWER CONSUMPTION REDUCTION

FIELD

Embodiments of the present invention may relate to power consumption reduction. More particularly, embodiments of the present invention may relate to power consumption reduction using dual edge-triggered flip-flop circuits.

BACKGROUND

Electronic devices, such as microprocessors, are steadily operating at faster and faster speeds. As microprocessors run at higher and higher speeds, the power delivered to the microprocessors by a power supply starts to become an issue. Power consumption has become a significant limiter in high-performance microprocessor design. One of the largest components of power consumption is the clocking subsystem, including clock generation, distribution, and clocking power consumed in flop-flops and latches. In order to achieve significant frequency increase, the pipelining depth typically increases with each new processor, hence increasing the number of clocked elements and further adding to the clocking power. At the same time, low jitter and skew requirements of the clock network result in significant distribution power.

BRIEF DESCRIPTION OF THE DRAWINGS

The foregoing and a better understanding of the present invention will become apparent from the following detailed description of arrangements and example embodiments and the claims when read in connection with the accompanying drawings, all forming a part of the disclosure of this invention. While the foregoing and following written and illustrated disclosure focuses on disclosing arrangements and example embodiments of the invention, it should be clearly understood that the same is by way of illustration and example only and the invention is not limited thereto.

The following represents brief descriptions of the drawings in which like reference numerals represent like elements and wherein:

FIG. 8 is an example computer systems platform.

DETAILED DESCRIPTION

Figure 1:
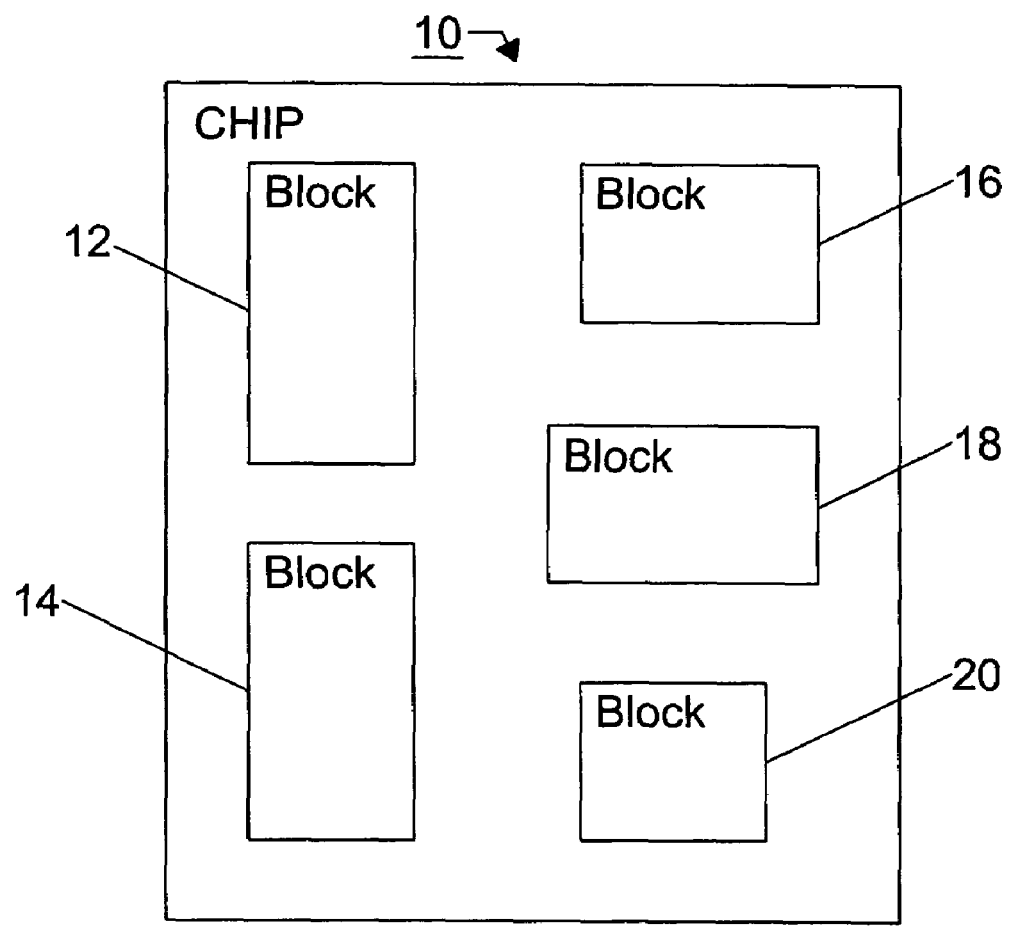
FIG. 1 illustrates a chip design partioned into a plurality of functional blocks according to one arrangement.

In the following detailed description, like reference numerals and characters may be used to designate identical, corresponding or similar components in differing figure drawings. Further, in the detailed description to follow, example sizes/models/values/ranges may be given although the present invention is not limited to the same. Well-known power/ground connections to integrated circuits (ICs) and other components may not be shown within the FIGS. for simplicity of illustration and discussion. Further, arrangements may be shown in block diagram form in order to avoid obscuring the invention, and also in view of the fact that specifics with respect to implementation of such block diagram arrangements may be dependent upon the platform within which the present invention is to be implemented. That is, the specifics are well within the purview of one skilled in the art. Where specific details are set forth in order to describe example embodiments of the invention, it should be apparent to one skilled in the art that the invention can be practiced without these specific details.

Embodiments of the present invention may relate to a chip design methodology for power reduction in an integrated circuit or semiconductor device (such as one containing a high-performance microprocessor design). This methodology may involve providing a first functional block having at least one phase logic circuit in a first area of a chip and providing a second functional block having at least one edge-triggered circuit in a second area of the chip. As will be described below, a phase logic circuit may include logic and/or circuitry that may depend on the phase and/or voltage level of the clock signal. The edge-triggered circuits (such as single edge-triggered components) within the second functional block may be replaced with dual edge-triggered circuits to reduce the overall clocking power of the chip. The chip design may provide (or be altered to provide) that the phase logic circuits are clocked with a first clock signal (or a full frequency clock) while the dual edge-triggered circuits are clocked with a second clock signal (or a half-frequency clock).

The first clock signal may be produced by (or output from) a phase lock loop (PLL) circuit and the second clock signal may be produced by (or output from) a divider circuit coupled to the PLL circuit. The first clock signal may be distributed to the functional blocks having the phase logic circuits and the second clock signal may be distributed to the functional blocks having the dual edge-triggered circuits.

Alternatively, the first clock signal may be distributed throughout the chip and the second clock signal may be produced by (or output from) divider circuits provided at (or near) an interface of the functional blocks having the dual edge-triggered circuits so as to produce the second clock signals.

FIG. 1 illustrates a chip design according to one arrangement. Other arrangements are also possible. More specifically, FIG. 1 illustrates a chip 10 that has a number of fabricated electronic devices such as flip-flops and/or transistors. The electronic devices are not shown for ease of illustration. The chip 10 may include a plurality of blocks such as block 12, block 14, block 16, block 18, and block 20. Each block may be considered a separate functional logical block. That is, the chip 10 may be partitioned based on different functionalities such as being divided into separate memory devices and logic devices. Each of the blocks 12–20 may surround a plurality of electronic devices on the chip 10 capable of operating (i.e., functioning) on their own such that each block surrounds a self-contained system.

As stated above, power consumption may result from the clocking of a chip. In order to conserve power, single edge-triggered flip-flops (also referred to as single edge-triggered flip-flop circuits) may be replaced by dual edge-triggered flip-flops (also referred to as dual/double edge-triggered flip-flop circuits) in a chip design. Dual edge-triggered flip-flops may sample data on both edges of the clock signal thereby allowing a clock signal to be distributed at half frequency while maintaining the same throughput as a full frequency single edge-triggered flip-flop. The half frequency clock distribution may result in a two times clocking power reduction of clock generation and distribution circuitry. Since the power dissipation may be proportional to the frequency of operation, the total power consumption of the chip may thereby be reduced. Further, since a significant portion of the total power of the circuit may be consumed in the clock distribution network, it may be advantageous to employ chips that operate on both edges of the clock. Replacing conventional single edge-triggered circuits with dual edge-triggered circuits may result in approximately 50% power savings in the clock distribution.

However, chip designs may also include elements (or components) that contain phase logic or similar types of logic. Phase logic may be logic or circuitry that may depend not only on the edge of a clock signal but also on the phase and/or voltage level of the clock signal. Therefore, phase logic circuits may place duty cycle requirements on the clock signal. For example, phase logic circuits may require that the high phase and the low phase of the clock signal are equal. Examples of phase logic include, but are not limited to, latch-based paths, register files, dynamic logic as well as most memory structures. If the clock frequency is halved (such as due to the use of dual edge-triggered circuits), then the phase logic components may no longer work at their required throughput. That is, these circuits must still be driven at a full frequency clock for proper operation.

Figure 2:
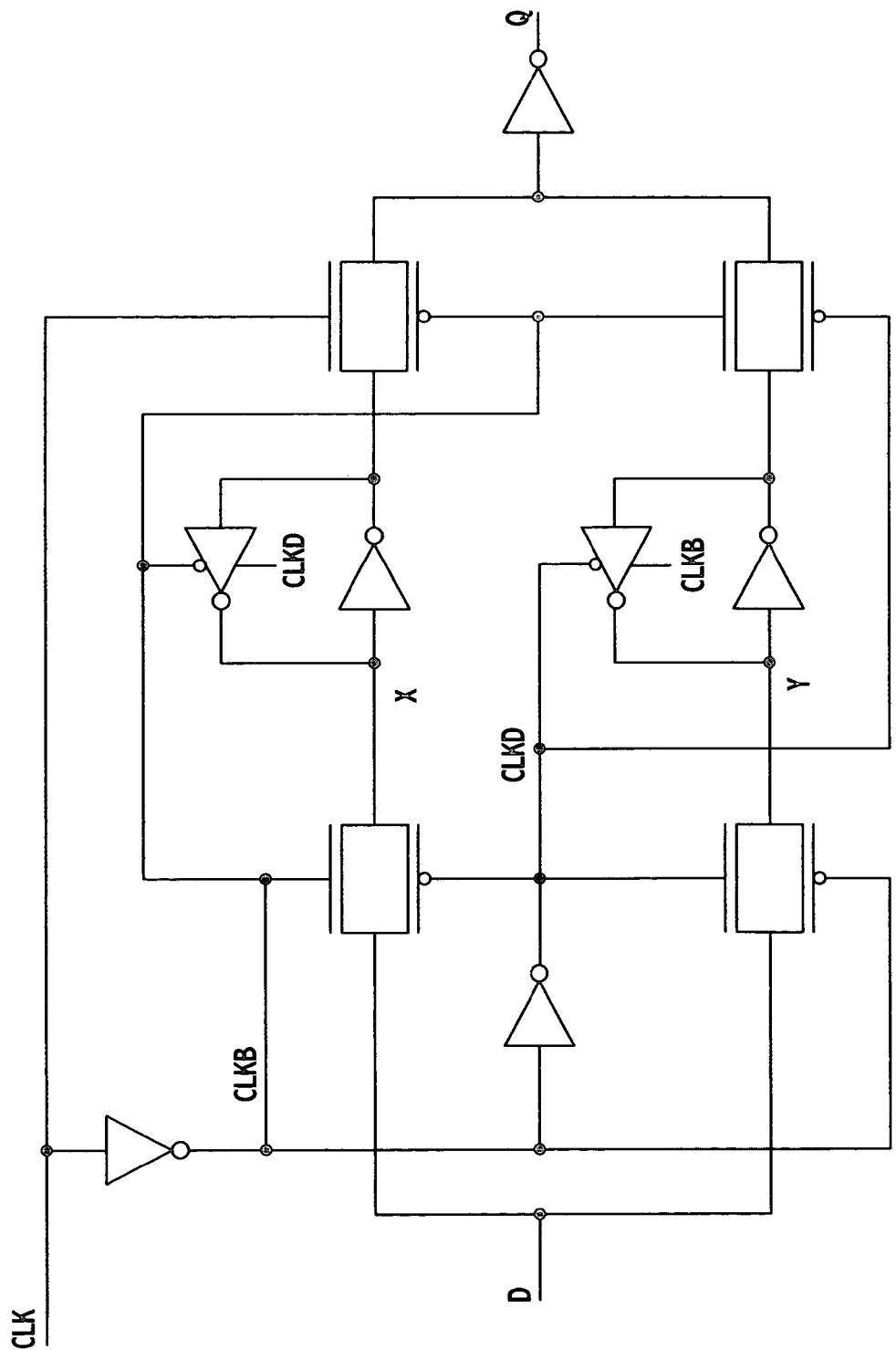
FIG. 2 illustrates a dual edge-triggered flip-flop circuit according to one arrangement.
Figure 3:
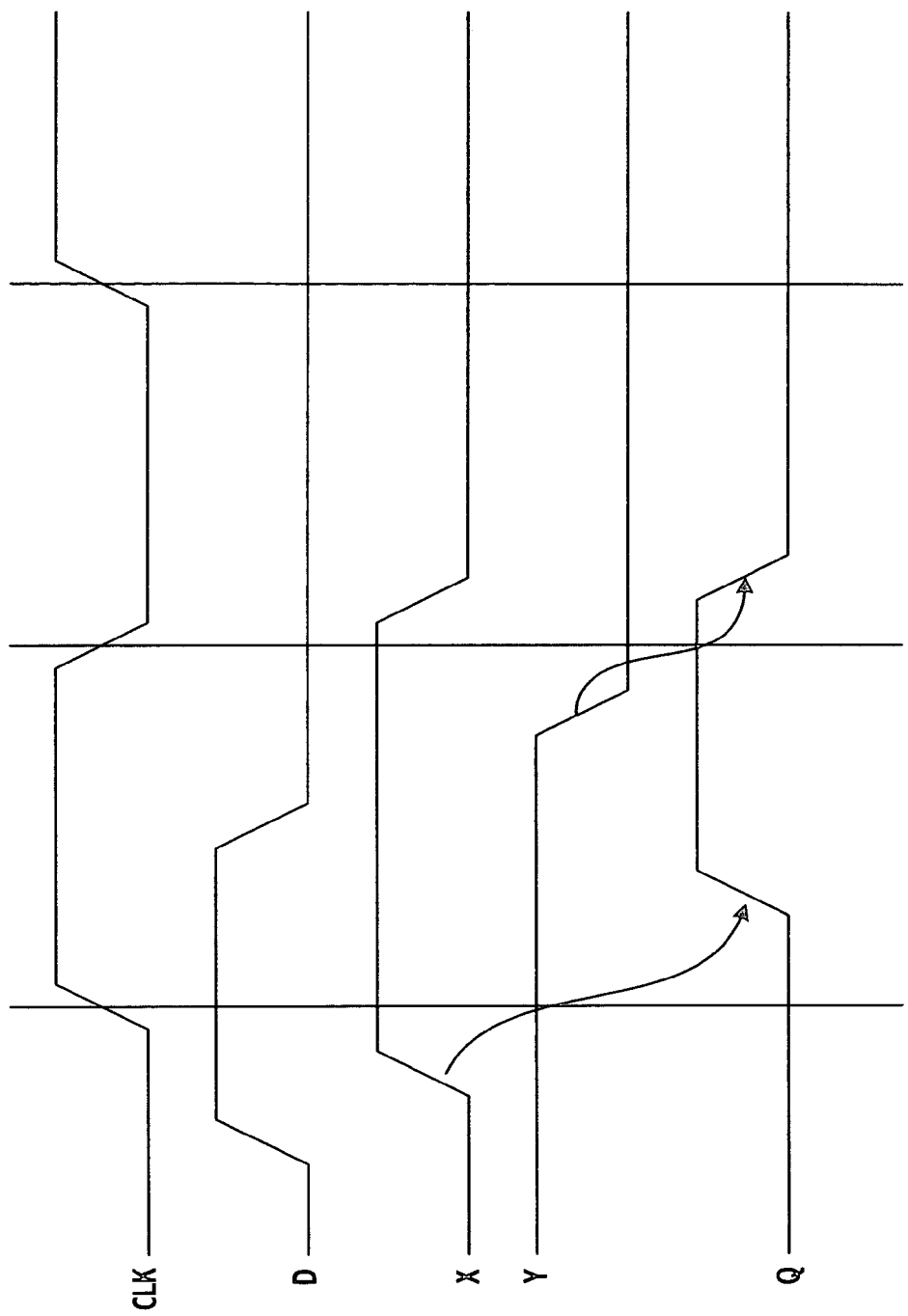
FIG. 3 is a timing diagram of a dual edge-triggered flip-flop circuit according to one arrangement.

FIG. 2 illustrates a dual edge-triggered flip-flop circuit according to one arrangement. Other arrangements for a dual edge-triggered flip-flop circuit are also possible. FIG. 2 is provided as an example of a dual edge-triggered circuit that may replace a single edge-triggered circuit in order to reduce power consumption of a chip. More specifically, FIG. 2 shows a dual edge-triggered master slave D/Q flip-flop circuit. This flip-flop circuit operates such that data from a D input may be latched on both a rising and falling edge of the clock signal CLK. FIG. 3 is a timing diagram of the dual edge-triggered flip-flop circuit shown in FIG. 2 according to one arrangement. While FIGS. 2 and 3 show one example of a dual edge-triggered flip-flop circuit, other dual edge-triggered flip-flop circuits and timing diagrams are also well known in the art.

Figure 4:
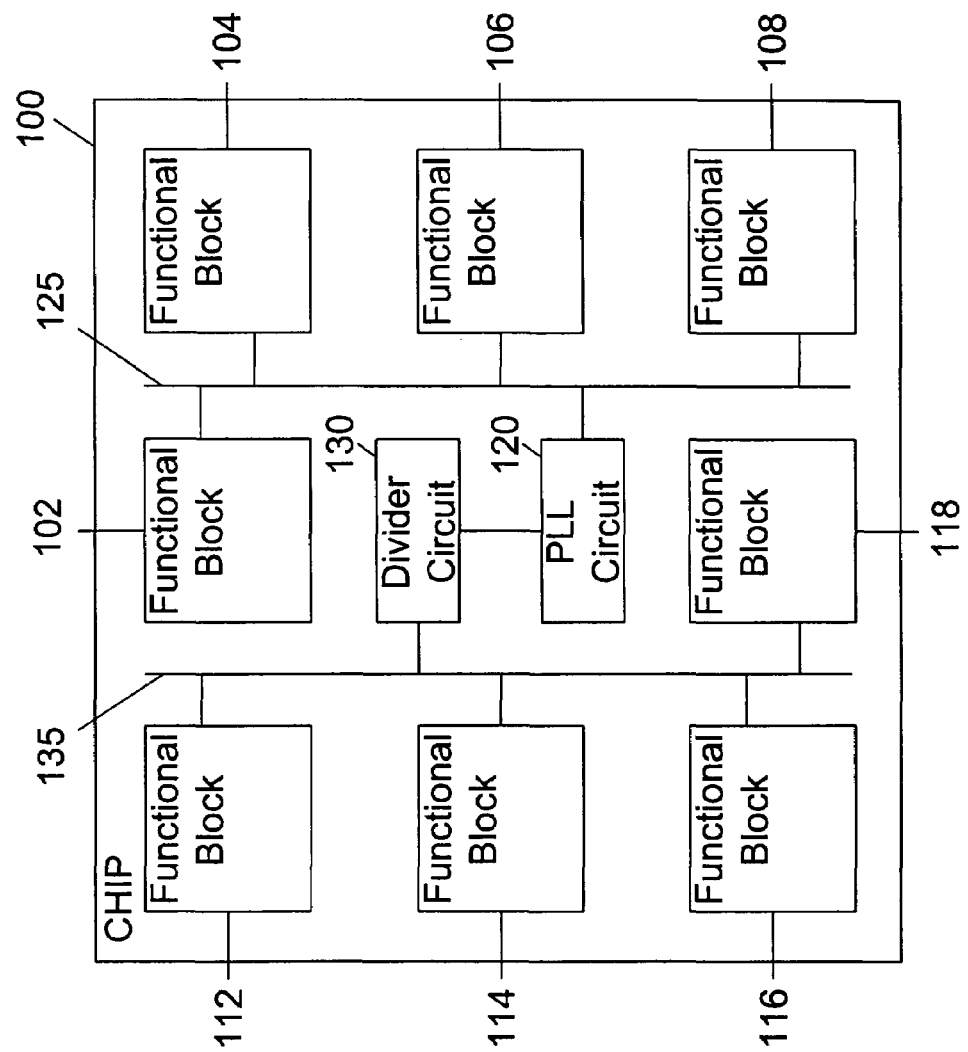
FIG. 4 illustrates a chip design according to an example embodiment of the present invention.

FIG. 4 illustrates a chip design having a clock distribution method according to an example embodiment of the present invention. Other embodiments are also within the scope of the present invention. More specifically, FIG. 4 shows a chip 100 (or chip design) that includes a plurality of functional blocks 102, 104, 106, 108, 112, 114, 116, and 118. An original chip design, such as shown in FIG. 1 for example, may be obtained prior to formation (or layout) of the components on the chip 100. The respective functional blocks may be arranged on the chip 100 depending on whether each functional block includes edge-triggered circuits or phase logic circuits.

Embodiments of the present invention may alter the original chip design (or previous chip design) such that phase logic circuits are provided in one area of the chip and edge-triggered circuits are provided in another area of the chip. That is, the functional blocks having the phase logic circuits may be arranged within a first area of the chip (e.g. the right hand side area and top center area of FIG. 4). Additionally, the functional blocks having the edge-triggered circuits may be arranged within a second area of the chip (e.g. the left hand side area and bottom center area of FIG. 4).

FIG. 4 shows that the functional blocks 102, 104, 106 and 108 having the phase logic circuits are provided within a first area of the chip 100 because they include the phase logic circuits and will be clocked by a full frequency clock signal. Additionally, the functional blocks 112, 114, 116 and 118 having the edge-triggered circuits are provided within a second area of the chip 100 because they include edge-triggered circuits and will be clocked by a half frequency clock signal.

The edge-triggered circuits within the functional blocks 112, 114, 116 and 118 may be replaced by and/or altered to include dual edge-triggered circuits so as to provide a power reduction for the chip 100. As such, the chip design may be altered such that the functional blocks 112, 114, 116 and 118 include dual edge-triggered circuits (such as dual edge-triggered flip-flop circuits). Because the dual edge-triggered circuits operate based on two edges of a clock signal, a frequency of the clock signal applied to these circuits needs to be cut in half (i.e., operate at a half-frequency of the full-frequency clock signal).

In order to properly operate the chip, the respective functional blocks and more specifically the circuits/components within the functional blocks need to be appropriately clocked. FIG. 4 shows that the chip design includes a phase lock loop (PLL) circuit 120 to provide a full frequency clock signal that may be distributed about the chip 100. FIG. 4 also shows that the chip design includes a first clock distribution tree 125 (or first clock distribution network) that distributes a first clock signal (i.e., a medium clock signal or mclk signal) from the PLL circuit 120 to various functional blocks such as the functional blocks 102, 104, 106 and 108. While FIG. 4 only shows the first clock distribution tree 125 provided about one area of the chip 100, the clock distribution tree 125 may be provided throughout the entire chip 100 or in various parts of the chip 100 in order to appropriately provide the first clock signal of a full-frequency.

FIG. 4 also shows that the chip design includes a divider circuit 130 coupled to the PLL circuit 120 to provide a half frequency clock signal that may be distributed about the chip 100. The divider circuit 130 divides the full frequency clock signal output by the PLL circuit 120 in half so as to provide a second clock signal at a half frequency. That is, the frequency of the first clock signal output by the divider circuit 130 is one-half the frequency of the first clock signal output by the PLL circuit 120.

FIG. 4 also shows that the chip design includes a second clock distribution tree 135 (or second clock distribution network) that distributes the second clock signal (i.e., a slow clock signal or sclk signal) to the functional blocks 112, 114, 116, and 118. Thus, the second clock signal output by the divider circuit 130 may be input to the functional blocks having the dual edge-triggered flip-flop circuits. As such, the dual edge-triggered flip-flop circuits will appropriately output data based on the full frequency timing. While FIG. 4 only shows the second clock distribution tree 135 provided about one area of the chip 100, the clock distribution tree 135 may be provided throughout the entire chip 100 or in various parts of the chip 100 in order to appropriately provide the second clock signal of half frequency.

Stated differently, FIG. 4 shows a chip design (for a microprocessor or other device) that includes a plurality of circuit blocks. Some of the circuit blocks may include circuitry that requires a full frequency phase clock whereas other circuit blocks may contain flip-flop circuits without any phase logic circuits. These flip-flop circuits may be clocked by a half frequency clock and perform essentially the same overall function as compared to when single edge-triggered flip-flop circuits are clocked with a full frequency clock signal. The logic of the chip design may be partitioned so that the phase logic circuit blocks (i.e., the blocks 102, 104, 106 and 108) are all located in an area of the die separate from the dual edge-triggered circuits. The clock distribution tree (or network) may be segmented into two distinct parts, namely a first clock distribution tree 125 and a second clock distribution tree 135. The first clock distribution tree 125 may distribute a full frequency clock signal to the blocks 102, 104, 106 and 108 and the second clock distribution tree 135 may distribute a half frequency clock signal to the other functional blocks 112, 114, 116 and 118.

The half frequency clock may be generated directly near or substantially near the phase lock loop circuit 120 by using the divider circuit 130 (i.e., a 2× frequency divider circuit). Because the logic has been partitioned between the two clock domains, the distribution of each resulting clock may be smaller than the original distribution. The portion of the die that has been converted into dual edge-triggered clocking may achieve, for example, approximately two times reduction in the clock distribution power while the power of the phase clock portion of the die may not change significantly.

Figure 5:
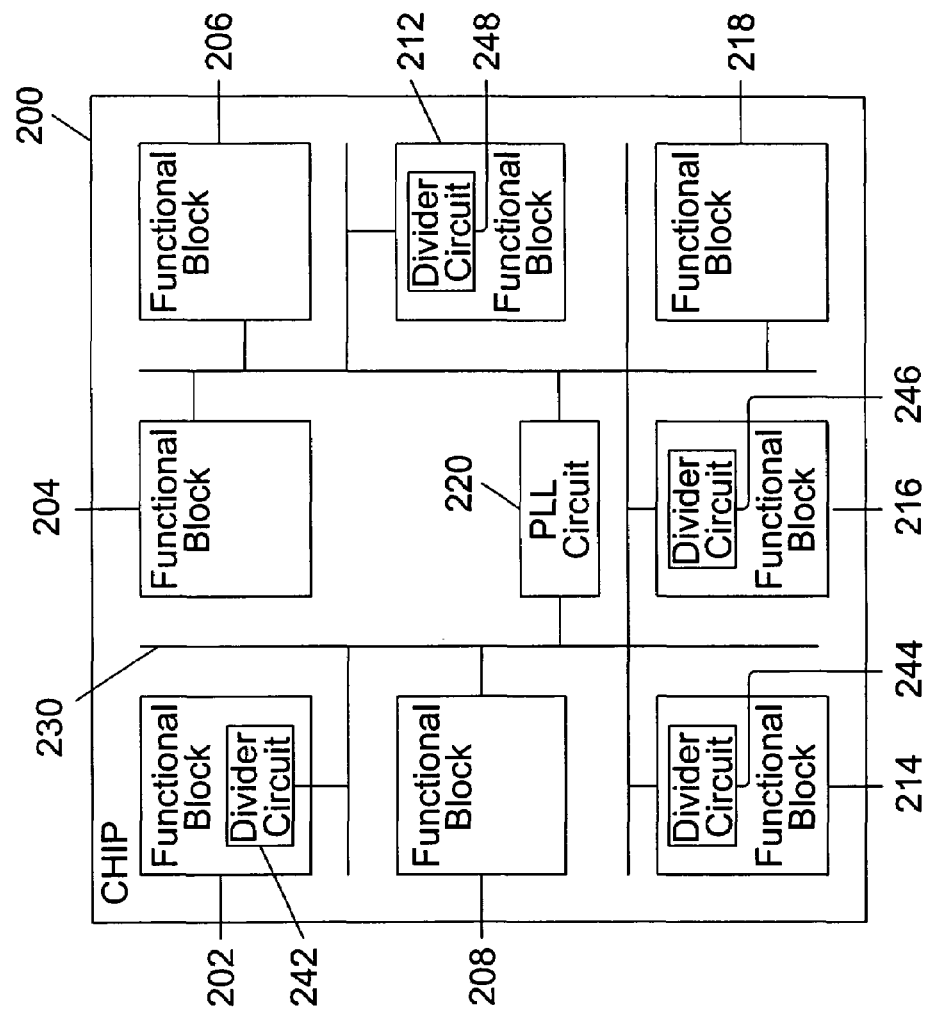
FIG. 5 illustrates a chip design according to an example embodiment of the present invention.

FIG. 5 illustrates a chip having a clock distribution method according to another example embodiment of the present invention. Other embodiments and configurations are also within the scope of the present invention. More specifically, FIG. 5 shows a chip 200 (or chip design) that includes a plurality of functional blocks 202, 204, 206, 208, 212, 214, 216 and 218 that have been arranged on the chip 200. In this example, the functional blocks 204, 206, 208 and 218 contain phase logic circuits, whereas the functional blocks 202, 212, 214 and 216 contain edge-triggered circuits (without phase logic circuits). At least one functional block having a phase logic circuit may be arranged within one area of the chip. For example, the functional block 204 having phase logic circuits may be arranged at a top center area of the chip 200. At least one functional block having edge-triggered circuits may be arranged within another area of the chip. For example, the functional block 202 having edge-triggered circuits may be arranged at a top left of the chip 200. For ease of illustration, the arrangement of the other functional blocks on the chip 200 will not be explained.

In a similar manner as discussed above, edge-triggered circuits of the chip design may be replaced with dual edge-triggered circuits so as to reduce the power consumption of the chip 200. This may occur before, during or after the arrangement of the functional blocks of the chip.

FIG. 5 shows that the chip design includes a PLL circuit 220 to provide a full frequency clock signal (or first clock signal) that may be distributed about the chip 200. FIG. 5 also shows that the chip design includes a first clock distribution tree 230 (or first clock distribution network) that distributes the first clock signal (i.e., a mclk signal) from the PLL circuit 220 to each of the functional blocks.

In this embodiment, each of the functional blocks having a dual edge-triggered flip-flop circuit may include a divider circuit located substantially at and/or substantially near an interface of the respective functional blocks. More specifically, the functional block 202 includes a divider circuit 242 that divides the frequency of the first clock signal on the first clock distribution 230 in half so as to provide a second clock signal (of a half frequency). The half frequency clock signal produced by the divider circuit 242 may then be distributed to components of the functional block 202 (including the dual edge-triggered circuits) by use of a clock distribution tree located within the functional block 202. Similarly, the functional block 212 includes a divider circuit 248, the functional block 214 includes a divider circuit 244 and the functional block 216 includes a divider circuit 246. Operations of each of the divider circuits is similar to operations of the divider circuit 242 and therefore will not be further discussed. Each of the functional blocks may include a clock distribution tree to appropriately distribute the half frequency signal produced by the corresponding divider circuit. While FIG. 5 shows divider circuits located within each of the respective functional blocks, the divider circuits may be located at different areas including outside the functional blocks or substantially near the functional blocks. Although not shown in FIG. 5, functional blocks may share divider circuits.

Stated differently, FIG. 5 shows a chip design in which the phase logic blocks and the dual edge-triggered clock blocks are interspersed throughout the die (or chip 200). The global clock distribution, as driven by the PLL circuit 220, may be a full frequency clock signal. The phase logic blocks may be coupled to a clock distribution network in a similar manner as shown in FIG. 4. The blocks that contain the dual edge-triggered circuits may have (or be associated with) local clock dividers that divide the global clock before (or substantially at a same time) as the full frequency clock signal enters the local or regional clock distribution trees. The remainder of the local clock distribution within each of the blocks containing the dual edge-triggered circuits may be a half frequency clock signal. This may be advantageous since a majority of the clocking power may be dissipated through the local distribution as well as the local clock buffers in the flip-flops. The power consumption may be reduced by two times as compared with an original design without dual edge-triggered clocking.

Figure 6:
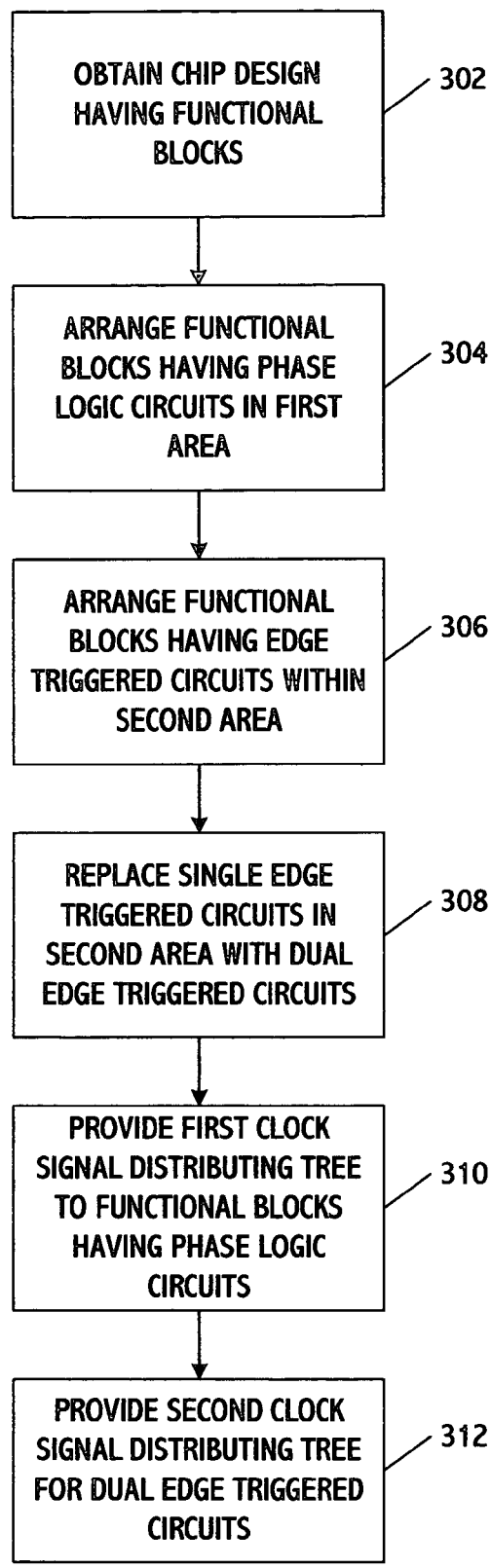
FIG. 6 is a flowchart showing operations of an example embodiment of the present Invention.

FIG. 6 is a flowchart showing operations of an example embodiment of the present invention. Other operations, orders of operations and embodiments are also within the scope of the present invention.

More specifically, FIG. 6 shows a methodology for power reduction consumption during the design of a chip or die. In operation 302, a chip design having functional blocks may be obtained. In operation 304, the functional blocks having phase logic circuits may be arranged in a first area of the chip. In operation 306, the functional blocks having edge-triggered circuits may be arranged within a second area of the chip. While FIG. 6 shows operation 306 occurring after operation 304, operations 306 may be performed simultaneously, substantially simultaneously or prior to operation 304. Additionally, the chip design may be such that operation 304 and/or operation 306 may not need to be performed since the chip design may be already appropriately arranged.

In operation 308, single edge-triggered circuits in the second area may be replaced with dual edge-triggered circuits. While FIG. 6 shows operation 308 after operation 304 and operation 306, operation 308 may occur prior to, simultaneously with and/or substantially simultaneously with operation 304 and/or operation 306.

In operation 310, the first clock signal distributing tree may be provided to functional blocks having the phase logic circuits. Additionally, in operation 312, the second clock distributing tree may be provided to the functional blocks having the dual edge-triggered circuits. The order of operations of each of operations 310 and 312 with respect to each other or with respect to the other operations may be other than those as shown in FIG. 6.

Figure 7:
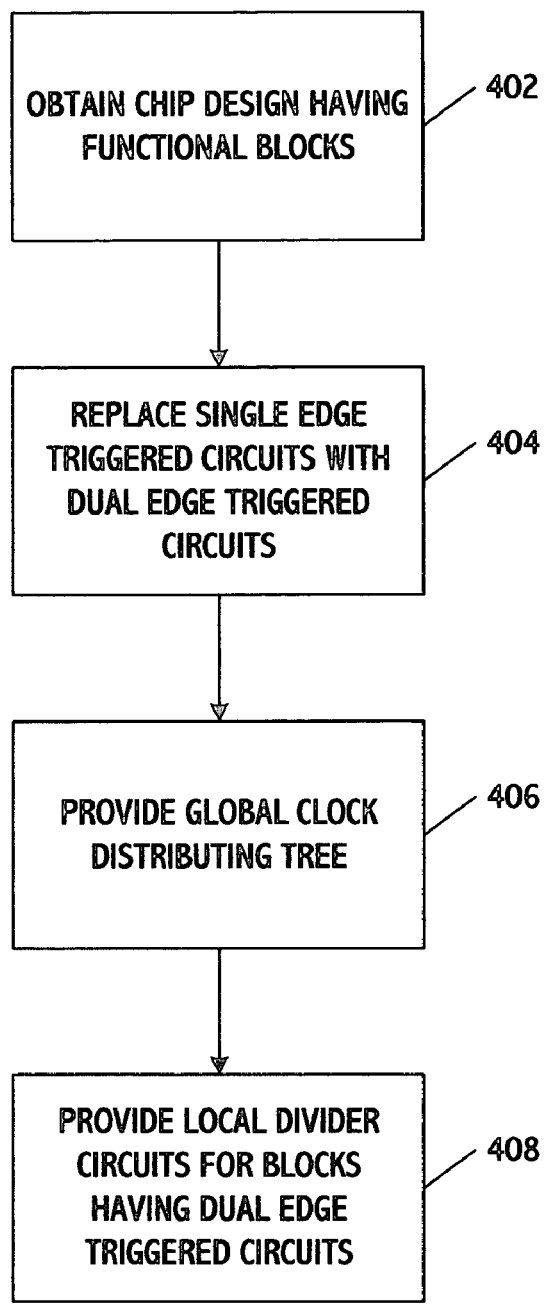
FIG. 7 is a flowchart showing operations of an example embodiment of the present invention.

FIG. 7 is a flowchart showing operations of an example embodiment of the present invention. Other operations, orders of operations and embodiments are also within the scope of the present invention.

More specifically, FIG. 7 shows that in operation 402, a chip design having functional blocks may be obtained. The functional blocks within the chip may be arranged in any one of various manners. For example, one functional block having phase logic may be arranged in one area of the chip and one functional block having edge-triggered circuits may be arranged in another area of the chip. In operation 404, single edge-triggered circuits of various functional blocks may be replaced with dual edge-triggered circuits. In operation 406, a global clock distributing tree may be provided to the functional blocks and in operation 408, local divider circuits may be provided for functional blocks having dual edge-triggered circuits that will utilize a half-frequency clock signal. As indicated above, the order of operations 404, 406 and 408 may be different than as specifically shown in FIG. 7.

FIG. 8 shows an example computer systems platform that may include a chip designed as described above. Other computer systems platforms are also possible. As shown in FIG. 8, the computer system 500 may include a processor subsystem 510, a memory subsystem 520 coupled to the processor subsystem 510 by a front side bus 515, graphics 530 coupled to the memory subsystem 520 by a graphics bus 535, one or more host chipsets (labeled 540–550) coupled to the memory subsystem 520 by hub links 545 and 555 for providing an interface with peripheral buses such as Peripheral Component Interconnect (PCI) buses 560 and 570 of different bandwidths and operating speeds, a flash memory 580, and a super I/O 590 coupled to the chipset 550 by a low pin count (LPC) bus for providing an interface with a plurality of I/O devices 610 such as a keyboard controller for controlling operations of an alphanumeric keyboard, a cursor control device such as a mouse, track ball, touch pad, joystick, etc., a mass storage device such as magnetic tapes, hard disk drives (HDD), and floppy disk drives (FDD), and serial and parallel ports to printers, scanners, and display devices. A plurality of I/O devices 620 may be provided along the PCI bus 560. The computer system 500 may be configured differently or employ some or different components than those shown in FIG. 8.

The processor subsystem 510 may include a plurality of host processors and a cache subsystem 512. The memory subsystem 520 may include a memory controller hub (MCH) 522 coupled to the host processors by the front side bus 515 (i.e., host or processor bus) and at least one memory element 524 coupled to the MCH 522 by a memory bus 526. The memory element 524 may be a dynamic random-access-memory (DRAM), or may be a read-only-memory (ROM), video random-access-memory (VRAM) and the like. The memory element 524 stores information and instructions for use by the host processors. The graphics 520 may be coupled to the main controller hub 522 of the memory subsystem 520 by graphics bus 535, and may include, for example, a graphics controller, a local memory and a display device (e.g., cathode ray tube, liquid crystal display, flat panel display, etc.). As indicated above, a chip (or chipset) as described above, may be provided within the computer system 500.

Embodiments of the present invention have been described that include replacing various circuits (such as single edge-triggered circuits) with dual edge-triggered circuits (such as dual edge-triggered flip-flop circuits). A half-frequency clock signal may be applied to the dual edge-triggered circuits to reduce the power consumption of the chip.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc.

Although embodiments of the present invention have been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A chip design method comprising:
providing a first functional block having a phase logic circuit in a first area of a chip design, the phase logic circuit including circuitry that depends on a phase or a voltage level of a clock signal;
providing a second functional block having an edge-triggered circuit in a second area of the chip design; and
replacing the edge-triggered circuit within the second functional block of the chip design with a dual edge-triggered circuit;
providing a first clock signal in the chip design to clock the phase logic circuit; and
providing a second clock signal in the chip design to clock the dual edge-triggered circuit, the second clock signal being different than the first clock signal.

2. The method of claim 1, wherein a frequency of the second clock signal is one-half a frequency of the first clock signal.

3. The method of claim 1, wherein providing the second clock signal in the chip design includes providing the second clock signal using a divider circuit located external to the second functional block.

4. The method of claim 1, wherein providing the second clock signal in the chip design includes providing the second clock signal using a divider circuit located substantially at an interface of the second functional block.

5. The method of claim 1, further comprising providing a third functional block having an edge-triggered circuit in the second area of the chip design, and replacing the edge-triggered circuit within the third functional block of the chip design with a dual edge-triggered circuit.

6. The method of claim 5, wherein providing the second clock signal includes providing the second clock signal in the chip design to clock the dual edge-triggered circuits of the second functional block and the third functional block.

7. The method of claim 6, wherein providing the second clock signal in the chip design includes providing the second clock signal using a divider circuit located external to the second functional block and the third functional block.

8. The method of claim 5, further comprising:
providing a third clock signal in the chip design to clock the dual edge-triggered circuit of the third functional block.

9. The method of claim 1, wherein providing the second clock signal in the chip design includes providing the second clock signal using a divider circuit located substantially at an interface of the second functional block.

10. The method of claim 1, wherein the first functional block is different than the second functional block.

11. A chip design method comprising:
arranging a chip design such that a first functional block having a phase logic circuit is provided in a first area of a chip and a second functional block having a dual edge-triggered circuit is provided in a second area of the chip, the phase logic circuit being a circuit that depends on a phase or a voltage level of a clock signal, the first functional block being different than the second functional block; and
arranging the chip design such that a first clock signal is distributed to said first functional block and a second clock signal is distributed to the dual edge-triggered circuit, the second clock signal being different than the first clock signal.

12. The method of claim 11, wherein the dual edge-triggered circuit comprises a dual edge-triggered flip-flop circuit.

13. The method of claim 12, further comprising arranging the chip design such that further functional blocks having dual edge-triggered circuits are provided in the second area of the chip.

14. The method of claim 13, further comprising arranging the chip design such that further functional blocks having phase logic circuits are provided in the first area of the chip.

15. The method of claim 11, further comprising replacing single edge-triggered circuits within the second functional block of the chip design with dual edge-triggered circuits.

16. The method of claim 11, wherein arranging the chip design such that the first clock signal is distributed to said first functional block and the second clock signal is distributed to the dual edge-triggered circuits comprises arranging the chip design to divide the first clock signal in half such that a frequency of the first clock signal is twice a frequency of the second clock signal.

17. The method of claim 16, wherein dividing the first clock signal is performed by a divider circuit located substantially at an interface of the second functional block.

18. The method of claim 16, wherein dividing the first clock signal is performed by a divider circuit located external to the second functional block.

19. The method of claim 11, wherein the first clock signal comprises a full-frequency clock signal and the second clock signal comprises a half-frequency clock signal.

20. The method of claim 11, wherein a frequency of the second clock signal is one-half a frequency of the first clock signal.

21. A method of designing a chip comprising:
providing phase logic circuits in a first functional block of a chip design;
providing single edge-triggered circuits in a second functional block of the chip design;
replacing the single edge-triggered circuits in the second functional block with dual edge-triggered circuits in the second functional block of the chip design; and
arranging the chip design to supply a first clock signal to the phase logic circuits and a second clock signal to the dual edge-triggered circuits, the second clock signal being based on the first clock signal.

22. The method of claim 21, wherein a frequency of the second clock signal is one-half a frequency of the first clock signal.

23. The method of claim 22, wherein arranging the chip design includes providing the second clock signal in the chip design using a divider circuit located external to the second functional block.

24. The method of claim 22, wherein arranging the chip design includes providing the second clock signal in the chip design using a divider circuit located substantially at an interface of the second functional block.

* * * * *